US009864820B2

(12) United States Patent
Shokooh et al.

(10) Patent No.: US 9,864,820 B2
(45) Date of Patent: Jan. 9, 2018

(54) GENERATOR DYNAMIC MODEL PARAMETER ESTIMATION AND TUNING USING ONLINE DATA AND SUBSPACE STATE SPACE MODEL

(71) Applicant: OPERATION TECHNOLOGY, INC., Irvine, CA (US)

(72) Inventors: Farrokh Shokooh, Laguna Beach, CA (US); Tanuj Khandelwal, Riverside, CA (US); Ahmed Yousuf Saber, Lake Forest, CA (US); J. J. Dai, Irvine, CA (US)

(73) Assignee: OPERATION TECHNOLOGY, INC., Irvine, CA (US)

( * ) Notice: Subject to any disclaimer, the term of this patent is extended or adjusted under 35 U.S.C. 154(b) by 586 days.

(21) Appl. No.: 14/045,757

(22) Filed: Oct. 3, 2013

(65) Prior Publication Data

US 2015/0100282 A1    Apr. 9, 2015

Related U.S. Application Data

(60) Provisional application No. 61/709,160, filed on Oct. 3, 2012.

(51) Int. Cl.
*G06G 7/48* (2006.01)
*G06F 17/50* (2006.01)

(52) U.S. Cl.
CPC ............... *G06F 17/5009* (2013.01)

(58) Field of Classification Search
CPC .................................... G06F 17/5009
USPC .................................................. 703/7
See application file for complete search history.

(56) References Cited

U.S. PATENT DOCUMENTS

| 7,693,608 | B2 | 4/2010 | Nasle |
| 7,729,808 | B2 | 6/2010 | Nasle et al. |
| 7,826,990 | B2 | 11/2010 | Nasle et al. |
| 7,840,395 | B2 | 11/2010 | Nasle et al. |
| 7,840,396 | B2 | 11/2010 | Radibratovic et al. |
| 7,844,439 | B2 | 11/2010 | Nasle et al. |
| 7,844,440 | B2 | 11/2010 | Nasle et al. |
| 8,036,872 | B2 | 10/2011 | Nasle |
| 8,126,685 | B2 | 2/2012 | Nasle |
| 8,131,401 | B2 | 3/2012 | Nasle |
| 8,155,908 | B2 | 4/2012 | Nasle et al. |
| 8,155,943 | B2 | 4/2012 | Nasle |

(Continued)

OTHER PUBLICATIONS

Han Knudsen, "Extended Park's Transformation for 2×3-phase Synchronous Machine and Converter Phasor Model with Representation of AC Harmonics" IEEE 1994, pp. 126-132.*

(Continued)

*Primary Examiner* — Dwin M Craig
(74) *Attorney, Agent, or Firm* — One LLP

(57) ABSTRACT

Generator dynamic model parameter estimation and tuning using online data and subspace state space models are disclosed. According to one embodiment, a system comprises a sensor, a data acquisition network in communication with the sensor; a user console and an identification and tuning engine in communication with the data acquisition network, the user console, and a database. The database comprises one or more generator models, and the identification and tuning engine identifies and tunes parameters associated with a selected generator model.

13 Claims, 11 Drawing Sheets

(56) References Cited

U.S. PATENT DOCUMENTS

| | | |
|---|---|---|
| 8,165,723 B2 | 4/2012 | Nasle |
| 8,170,856 B2 | 5/2012 | Nasle |
| 8,180,622 B2 | 5/2012 | Nasle |
| 8,229,722 B2 | 7/2012 | Nasle |
| 8,321,194 B2 | 11/2012 | Meagher et al. |
| 8,401,833 B2 | 3/2013 | Radibratovic et al. |
| 8,494,830 B2 | 7/2013 | Radibratovic et al. |
| 8,577,661 B2 | 11/2013 | Nasle |
| 8,688,429 B2 | 4/2014 | Nasle et al. |
| 8,775,934 B2 | 7/2014 | Nasle et al. |
| 8,868,398 B2 | 10/2014 | Radibratovic et al. |
| 8,959,006 B2 | 2/2015 | Nasle |
| 9,031,824 B2 | 5/2015 | Nasle |
| 9,092,593 B2 | 7/2015 | Nasle |
| 9,111,057 B2 | 8/2015 | Radibratovic et al. |
| 9,557,723 B2 | 1/2017 | Nasle |
| 2003/0063723 A1* | 4/2003 | Booth ............... H02J 3/14 379/106.03 |
| 2005/0137834 A1* | 6/2005 | Heydt ............. G06F 17/5036 702/189 |
| 2005/0187643 A1* | 8/2005 | Sayyar-Rodsari ... G05B 13/042 700/29 |
| 2005/0187726 A1* | 8/2005 | Korba ............... H02J 3/24 702/60 |
| 2005/0240381 A1* | 10/2005 | Seiler .............. G06F 17/5009 703/1 |
| 2009/0113049 A1 | 4/2009 | Nasle et al. |
| 2011/0082597 A1 | 4/2011 | Meagher |
| 2015/0112907 A1 | 4/2015 | Nasle et al. |
| 2015/0153757 A1 | 6/2015 | Meagher |
| 2015/0178627 A1 | 6/2015 | Radibratovic et al. |
| 2015/0248617 A1 | 9/2015 | Nasle |
| 2016/0048757 A1 | 2/2016 | Nasle et al. |
| 2016/0196375 A1 | 7/2016 | Nasle |
| 2016/0246905 A1 | 8/2016 | Radibratovic et al. |
| 2016/0246906 A1 | 8/2016 | Radibratovic et al. |
| 2016/0247065 A1 | 8/2016 | Nasle et al. |
| 2017/0046458 A1 | 2/2017 | Meagher et al. |

OTHER PUBLICATIONS

H. Tsai, A.Keyhani, J. Demcjo, R.G. Farmer, "On-Line Synchronous Machine Parameter Estimation from Small Disturbance Operating Data", IEEE Transaction on Energy Conversion, 1995, vol. 10, No. 1, pp. 25-36.*

Cari, E. P. T., et al., "A New Methodology for Parameter Estimation of Synchronous Generator from Disturbance Measurements", IEEE Power and Energy Society General Meeting, Pittsburgh, Pennsylvania, Jul. 2008, pp. 1-7.

Cari, E. P. T., et al., "Parameter Estimation of Synchronous Generators from Different Types of Disturbances", IEEE Power and Energy Society General Meeting, Detroit, Michigan, Jul. 2011, pp. 1-7.

Ghandakly, A. A., et al., "An Adaptive Synchronous Generator Stabilizer Design by Generalized Multivariable Pole Shifting (GMPS) Technique", IEEE Transactions on Power Systems, 1992, vol. 7, No. 3, pp. 1239-1244.

Karayaka, H. B., et al., "Synchronous Generator Model Identification and Parameter Estimation From Operating Data", IEEE Transactions on Energy Conversion, 2003, vol. 18, No. 1, pp. 121-126.

Ljung, L., "System Identification—Theory for the User", Prentice Hall Information and System Sciences Series, 1999, $2^{nd}$ ed., pp. 1-609.

Tsai, C.C., et al., "PMU Based Generator Parameter Identification to Improve the System Planning and Operation", IEEE Power and Energy Society General Meeting, San Diego, California, Jul. 2012, pp. 1-8.

TSAI, H., et al., "On-line Synchronous Machine Parameter Estimation from Small Disturbance Operating Data", IEEE Transaction on Energy Conversion, 1995, vol. 10, No. 1, pp. 25-36.

Utkin, V. I., et al., "Sliding Mode Control on Electro-Mechanical Systems", Mathematical Problems in Engineering, 2002, vol. 8, Nos. 4-5, pp. 451-473.

Wang, J.C., et al., "Identification of Excitation System Models Based on On-line Digital Measurements", IEEE Transaction son Power Systems, 1995, vol. 10, No. 3, pp. 1286-1293.

* cited by examiner

GENERATOR DYNAMIC MODEL PARAMETER ESTIMATION AND TUNING USING ONLINE DATA AND SUBSPACE STATE SPACE MODEL

The present application claims the benefit of priority to U.S. Provisional Patent Application Ser. No. 61/709,160 filed Oct. 3, 2012, titled "Generator Dynamic Model Parameter Estimation/Tuning Using Online Data And Subspace State Space Model," the disclosure of which is hereby incorporated herein by reference in its entirety.

FIELD

The embodiments relate generally to control systems, and more particularly to generator dynamic model parameter estimation and tuning using online data and subspace state space model.

BACKGROUND

Knowledge of a rotating machine and its associated control system dynamic parameters is essential for power system transient stability simulation studies. A typical transmission power system model includes a number of frequency dependent components such as impedances, sources and loads. However, the most complex dynamic models with the largest number of variables (for example, greater than 100) to identify and tune belong to synchronous machines. What makes these parameters complex is that they are sometimes independent of each other but they still impact the overall response of the machine to an event (such as load shedding, power system fault or large load addition into the system). Examples of such parameters include machine impedances and time constants, inertial and damping coefficients, prime mover and governor parameters, excitation system and AVR parameters, power system stabilizer (PSS) parameters, and load characteristics. Accuracy in hundreds of these parameters directly affects the credibility of the simulation results. In order to verify and validate (V&V) simulation studies, it is common to compare simulation results against field test measurements such as a generator load acceptance and rejection test. However, expertise is required to understand the effect of each parameter, as the simulation model is manually tuned to provide a similar response as that observed in field tests or recordings. The task of adjusting each variable via the trial-and-error approach is a tedious and time-consuming one. A dynamic tuned model is invaluable to a transmission planner and their regulatory agencies in order to understand the dynamic response of a system as a function of time to potential disturbances in the system.

Dynamic parameter tuning (DPT) tunes parameters of dynamic models. Given transfer function model structures (e.g., exciters, governors, power system stabilizers, generators, wind turbines, electrical machines, FACTS devices, controllers), typical values of model parameters, power system network (if available), and field recorded data using smart sensor devices like PMUs, DPT tunes parameters of dynamic model (e.g., gains, transfer functions, integrators, derivative, time constants, limiters, saturation constants, dead zones, delay) where deviation between the recorded data and the calculated output of the model using the tuned parameters is minimum. In other words, DPT can be used to estimate the values of the parameters that make the controllers respond as similar as possible to a field measured response (i.e. measurements from a staged test or field recorded disturbance). The tuning response can be accomplished by using an iterative approach that automatically adjusts the tunable settings or parameters in the model to make the controller response match that of field recorded data. This process may also be known as automatic model validation parameter tuning.

A phasor measurement unit (PMU) or synchrophasor is a device that measures the electrical waves on an electricity grid, using a common time source for synchronization. A phasor is a complex number that represents both the magnitude and phase angle of the sine waves found in electricity. Time synchronization allows synchronized real-time measurements of multiple remote measurement points on the grid. In power engineering, these are also commonly referred to as synchrophasors and are considered one of the most important measuring devices in the future of power systems. A PMU can be a dedicated device, or the PMU function can be incorporated into a protective relay or other device.

DPT is a complex constraint optimization problem in huge complex multi-dimensional search space because the above mentioned dynamic systems are highly non-linear with limiters (saturations) and are highly sensitive to parameters; they have multiple inputs/outputs (multi-objective) and multiple solutions exist.

Particle swarm optimization (PSO) is a promising optimization method for engineering applications today. It is a swarm based iterative optimization method. Each potential solution, called a particle, flies in a multi-dimensional search space with a velocity, and the velocity is dynamically adjusted according to the flying experience of its own and other particles.

The least squares method is typically used for parameter identification (PI). Few products are available in the market for PI using mainly least square method and not a single product is available for parameter tuning (PT) where any intelligent optimization method is used.

It is very difficult and time consuming to tune the dynamic model parameters from time domain input and output values (curves or data points) because of complex relationships and high sensitivity. It is a complex constraint optimization problem in complex search space with thousands of data points including limits. Practical control systems have many complex control blocks with saturation limits (gains, transfer functions, integrators, derivative, time constants, limiters, saturation constants, dead zones, delay, etc.), and thus the traditional least square method is not suitable mainly for DPT where balance between local and global search is very important for fine tuning.

SUMMARY

Generator dynamic model parameter estimation and tuning using online data and subspace state space models are disclosed. According to one embodiment, a system comprises a sensor, a data acquisition network in communication with the sensor; a user console and an identification and tuning engine in communication with the data acquisition network, the user console, and a database. The database comprises one or more generator models, and the identification and tuning engine identifies and tunes parameters associated with a selected generator model.

The systems, methods, features and advantages of the invention will be or will become apparent to one with skill in the art upon examination of the following figures and detailed description. It is intended that all such additional methods, features and advantages be included within this description, be within the scope of the invention, and be protected by the accompanying claims. It is also intended that the invention is not limited to require the details of the example embodiments.

BRIEF DESCRIPTION

The accompanying drawings, which are included as part of the present specification, illustrate the presently preferred embodiment and, together with the general description given above and the detailed description of the preferred embodiment given below, serve to explain and teach the principles of the present invention.

Figure 1:
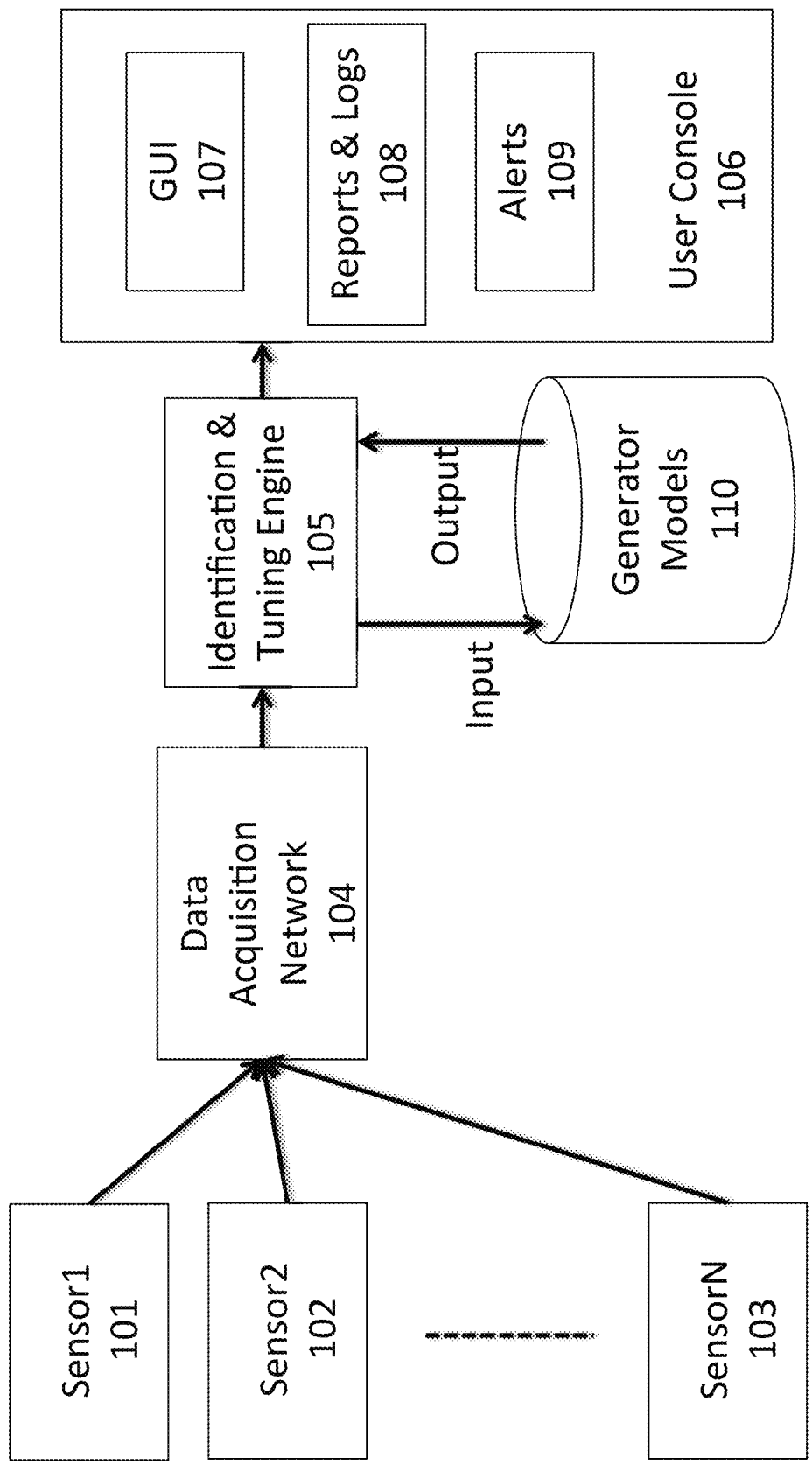
FIG. 1 illustrates an exemplary system level layout for use with the present system, according to one embodiment.

It should be noted that the figures are not necessarily drawn to scale and that elements of similar structures or functions are generally represented by like reference numerals for illustrative purposes throughout the figures. It also should be noted that the figures are only intended to facilitate the description of the various embodiments described herein. The figures do not necessarily describe every aspect of the teachings disclosed herein and do not limit the scope of the claims.

DETAILED DESCRIPTION

Embodiments disclosed herein are directed to methods and systems for generator dynamic parameter estimation and tuning with online data by employing a subspace state space model and identification method. The present embodiments can be applied in generators, exciters, governors, power system stabilizers, wind turbines, electrical machines, FACTS devices, and controllers.

According to one embodiment, the present system enables the use of 4SID (subspace-based system identification method) to tune a combined generator model including its control system on a continuous basis, adapting as the settings or performance change overtime. The generator model includes a machine and an excitation system. Dynamic tuning is typically done by generator testing which is not possible for generation plants that are obligated to supply their scheduled power and cannot tolerate any downtime. The present embodiments therefore are preferred for systems that lack field test data and are only accessible to online measurements that are continuously fed from some local meters and a network PMU.

Dynamic parameter tuning (DPT) is a constraint optimization problem to find the best set of tuned parameter values to match with given field-measured data. An intelligent optimization method is required to come up with the optimal or near optimal values of parameters to reduce deviation between measured field data and calculated outputs. Automatic DPT adds an additional new layer in time saving capabilities, saving hundreds of engineering man-hours spent on the tedious process of model validation and parameter tuning. Parameter tuning of a power system network is very important for modeling, simulation, control and protection because it affects many power system studies, e.g., transient stability, voltage distortion, relay setting and so on. Thus it is recommended to tune parameters over time for more accurate power system analysis results.

Applications of DPT include tuning and validating dynamic control elements of generic dynamic models. This includes but not limited to following types of controllers/dynamic models:

1) Synchronous Motors Exciter/AVR models;
2) Synchronous Generator Exciter/AVR models;
3) Synchronous Generator Turbine, Engine/Speed Control models;
4) Synchronous Generator PSS (Power System Stabilizer) models;
5) Wind Turbine Generator Models;
6) Generic Load Models (Lumped Load Element Dynamic Models).

The embodiments disclosed herein directed to DPT using MPSO can be applied in generators, exciters, governors, power system stabilizers, wind turbines, electrical machines, FACTS devices, controllers, etc. The embodiments described herein are generic, robust and they always converge. The embodiments described herein play an important role for modeling better power systems and help to simulate and build smarter grid.

The present disclosure provides advantages over prior art systems for the following reasons:

1) Dynamic parameters can heavily impact the quality of simulation results;
2) Manufacture data may not be suitable over time. Sometimes dynamic parameter values may not be available from manufactures;
3) Online field measured data is available in smart-grid;
4) Parameters are very sensitive;
5) There exists a complex input and output relation in a dynamic model; and
6) Verification and validation are not simple.

FIG. 1 illustrates an exemplary system level layout for use with the present system, according to one embodiment. According to one embodiment, a system includes a data acquisition network 104, a user console 106 that hosts a synchronous machine model including associated controls, and an identification & tuning (I&T) engine 105. The data acquisition component 104 is connected to one or more sensors (101, 102, 103) such as a PMU configured to provide real-time data and power quality waveforms from certain strategic locations in the power system. I&T engine 105 is connected to the data acquisition system 104 or the sensor(s) directly and one or more generator models 110. I&T engine 105 continuously captures events and triggers if a signal goes beyond a user-defined threshold and uses the event information to identify and/or tune the generator model 110 with parameters such that the simulated response from the generator model 110 matches actual measurements. I&T engine 105 is configured to analyze a difference between the identification and/or tuning from a previous event against a latest set of results. If the difference is significant, then the generator 110 parameters are updated making this an ongoing and continuous process. The new tuned set is logged and an alert 109 is sent to the user console 106 to retrieve and view a report 108. The report and calculation results are available to be displayed on a graphical user interface (GUI) 107. It is expected that over time, the difference between the latest and previous tuning results will reduce below the threshold such that the model has been sufficiently tuned with the help of a large number and variety of events. However, it does happen in the system that operations or maintenance make changes to the generator controllers by adjusting the dials on the generator control panel. Such a change may go unnoticed. Further, due to aging or lack of maintenance of the equipment, its performance may degrade over time. For every event therefore, the system is able to match the simulated response of the machine against the actual measurements and provide a valid machine model for power systems analysis purposes. If there are any changes made to the generator controllers, the system is able to detect the change as the latest tuned parameters will have discrepancy from the previously tuned and accepted set.

Figure 2:
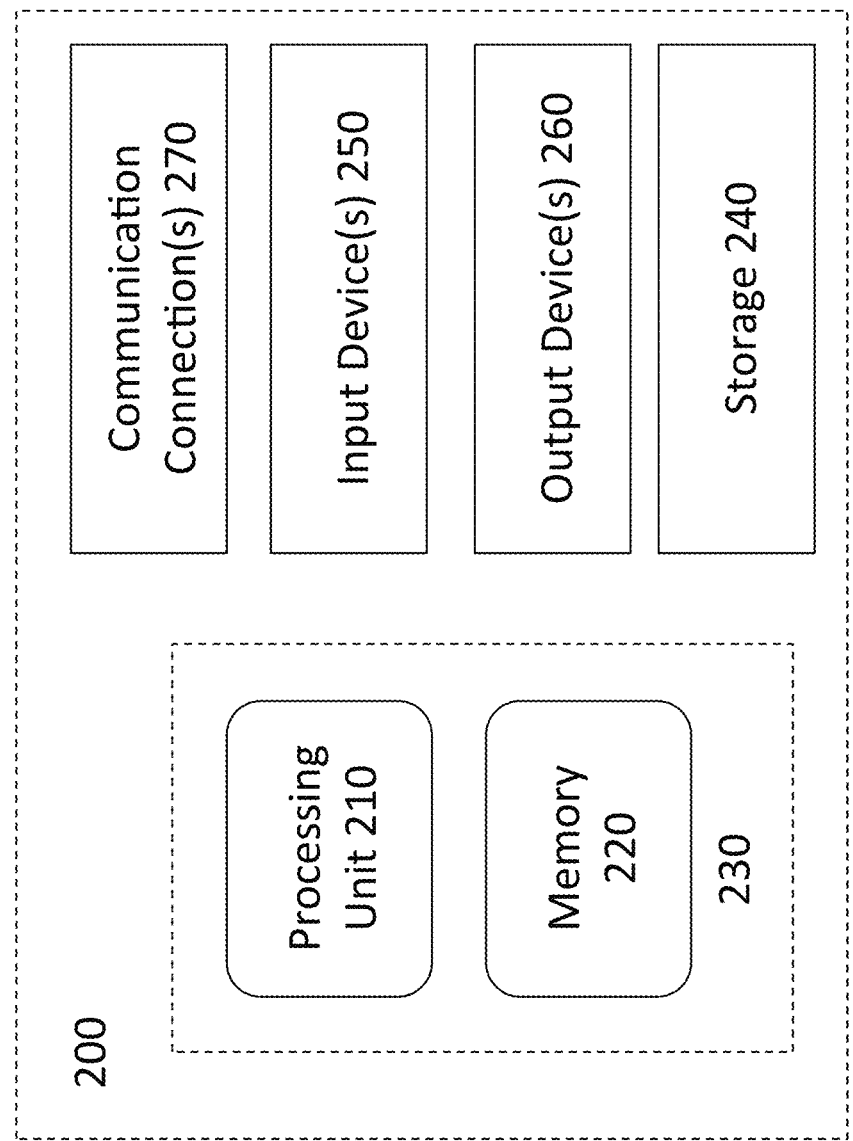
FIG. 2 illustrates an exemplary engine for use with the present system, according to one embodiment.

FIG. 2 illustrates an exemplary engine for use with the present system, according to one embodiment. The engine is not intended to suggest any limitation as to scope of use or functionality, as the technologies described herein may be implemented in diverse general-purpose or special purpose computing environments. With reference to FIG. 2, the engine 200 can include at least one processing unit 210 (e.g. signal processor, microprocessor, ASIC, or other control and processing logic circuitry) coupled to memory 220. The processing unit 210 executes computer-executable instructions and may be a real or a virtual processor. The memory 220 may be volatile memory (e.g. registers, cache, RAM), non-volatile memory (e.g. ROM, EEPROM, flash memory, etc.), or some combination of the two. The memory 220 can store software implementing any of the technologies described herein. The controller may have additional features. For example, the engine can include storage 240, one or more input devices 250, one or ore output devices 260, and one or more communication connections 270. An interconnection mechanism (not shown), such as a bus or network interconnects the components. Typically, operating system software (not shown) provides an operating environment for other software executing in the controller and coordinates activities of the components of the engine.

The storage 240 may be removable or non-removable, and can include magnetic disks, magnetic tapes or cassettes, CD-ROMs, CD-RWs, DVDs, or any other computer-readable media that can be used to store information and which can be accessed within the controller. The storage 240 can store software containing instructions for implementing the methods and systems described herein.

The input device(s) 250 can be a touch input device such as a keyboard, mouse, pen, or trackball, a voice input device, a scanning device, or another device. The output device(s) 260 may be a display, printer, speaker, CD- or DVD-writer, or another device that provides output from the controller. Some input/output devices, such as a touchscreen, may include both input and output functionality.

The communication connection(s) 270 enables communication over a communication mechanism to another computing entity. The communication mechanism conveys information such as computer-executable instructions, audio/video or other information, or other data. By way of example, and not limitation, communication mechanisms include wired or wireless techniques implemented with an electrical, optical, RF, microwaves, infrared, acoustic, or other carrier.

Figure 3:
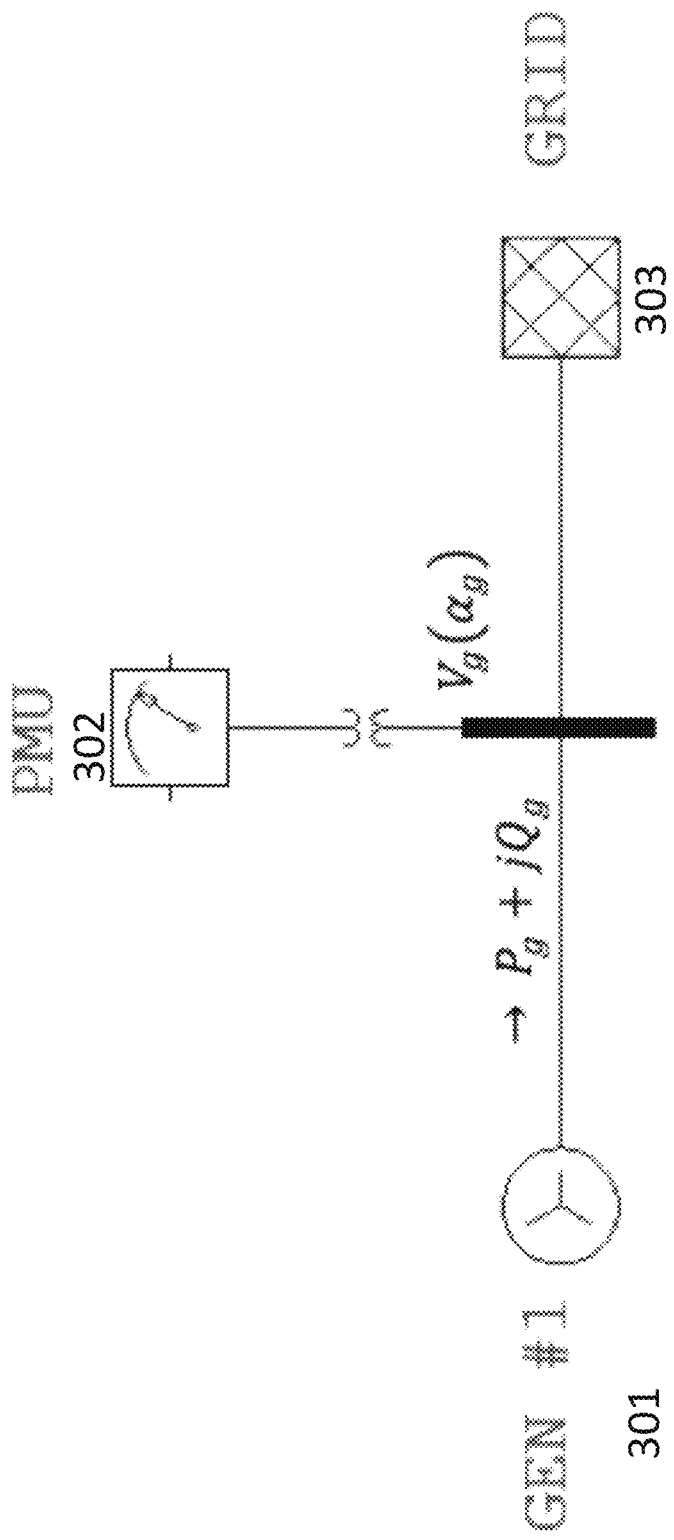
FIG. 3 illustrates an exemplary generator and PMU configuration for use with the present system, according to one embodiment.
Figure 7:
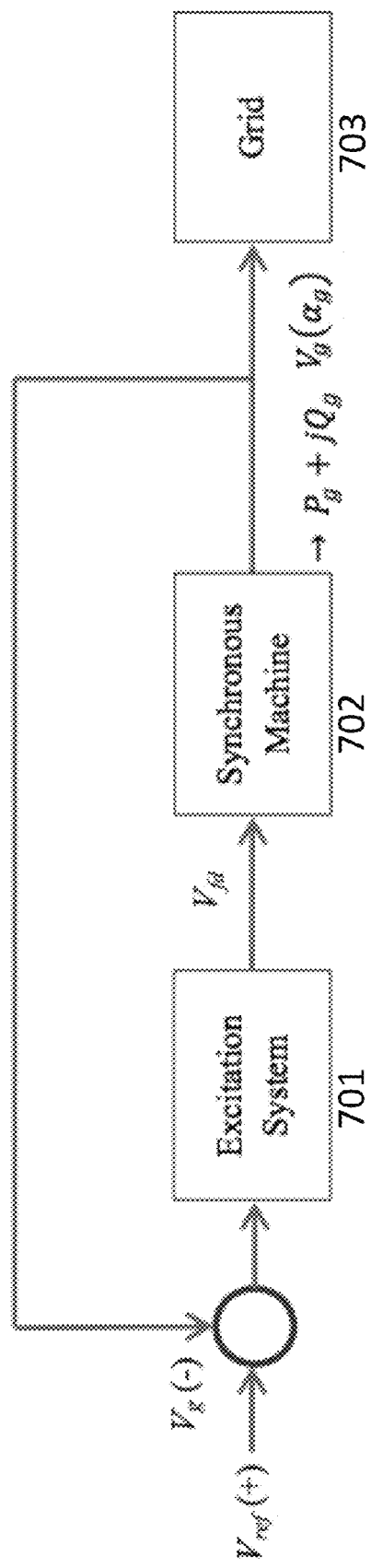
FIG. 7 illustrates an exemplary generator configuration with an excitation system for use with the present system, according to one embodiment.

FIG. 3 illustrates an exemplary generator and PMU configuration for use with the present system, according to one embodiment. The system under consideration consists of a generator 301, a terminal PMU 302 and its measurements, and an interconnected power grid 303. It is assumed the PMU 302 measures generator 301 terminal voltage magnitude $V_g$ and phase angle $\alpha_g$, as well as generator active power $P_g$ and reactive power $Q_g$ generations. The generator 301 includes a synchronous machine 702, an excitation system 701, and a feedback control loop as shown in FIG. 7.

Figure 4:
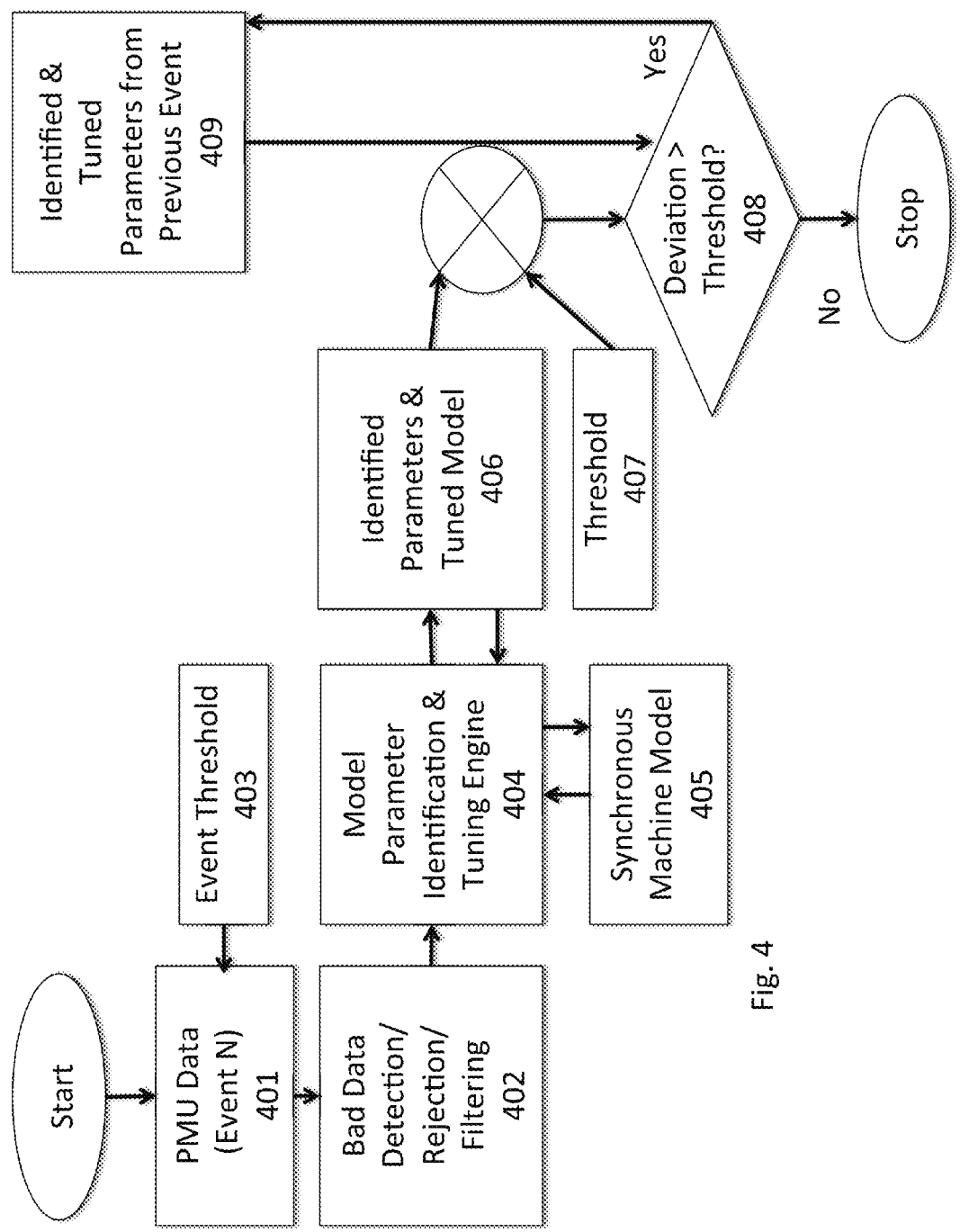
FIG. 4 illustrates an iterative and interactive process flow for use with the present system, according to one embodiment.

FIG. 4 illustrates a process flow for use with the present system, according to one embodiment. Synchronized data from a PMU for an event N 401, including an event threshold 403, is continuously reviewed. Bad data is detected, rejected, and/or filtered 402 before measured data is transmitted to a model parameter identification and tuning engine 404. Parameter identification and tuning is an iterative process. The model parameter identification and tuning engine 404 also receives a synchronous machine model 405 (with controls and parameters). Model and parameters for the generator are iteratively modified to minimize deviation between measured output(s) from PMUs and calculated corresponding output(s) from simulation. Deviation depends on system complexity, data availability and quality, and the optimization method applied. Optimization runs for a sufficient number of iterations so that a best model and parameters values are obtained. Identified parameters and a tuned model 406 are XOR'd (differentiated) with a deviation threshold 407. It should be noted that the event threshold is different from a deviation threshold. The output is compared to identified and tuned parameters from a previous event 409. If a deviation threshold 408 is not exceeded, the process is complete. Otherwise identified and tuned parameters from a previous event 409 are used.

A phasor measurement unit (PMU) or synchrophasor is a device that measures the electrical waves on an electricity grid, using a common time source for synchronization. A PMU can be a dedicated device, or the PMU function can be incorporated into a protective relay or other device. Using a PMU, it is simple to detect abnormal waveform shapes. A waveform shape described mathematically is called a phasor.

PMU measurements are the constraints to the dynamic model parameter estimation/tuning thus they should be enforced.

Construct a reduced order state space model:

$$\dot{x}_r(t) = A_r(\theta) x_r(t) + B_r(\theta) u_r(t) \tag{1}$$

$$y_r(t) = C_r x_r(t) \tag{2}$$

using the following conditions: Estimated generator dynamic model parameters. PMU measurements as model output $y_r$.

Further define a sliding-mode observer from Equations (1) and (12):

$$\dot{\hat{x}}_{r1}(t) = A_{r11}(\theta) \hat{x}_{r1}(t) + A_{r11}(\theta) \hat{y}_r(t) + B_{r1}(\theta) u_r(t) + L_1 v \tag{3}$$

$$\hat{y}_r(t) = A_{r21}(\theta)\hat{x}_{r1}(t) + A_{r22}(\theta)\hat{y}_r(t) + B_{r2}(\theta)u_r(t) - L_2 v \quad (4)$$

$$v = sgn(y_r - \hat{y}_r) \quad (5)$$

Solving Equations (3), (4) and (5) using recursive least square (RLS) method by properly selecting weighting matrices $L_1$ and $L_2$, PMU measurement error v are forced to converge to zero. Thus the updated dynamic model parameters θ have better values.

Figure 5:
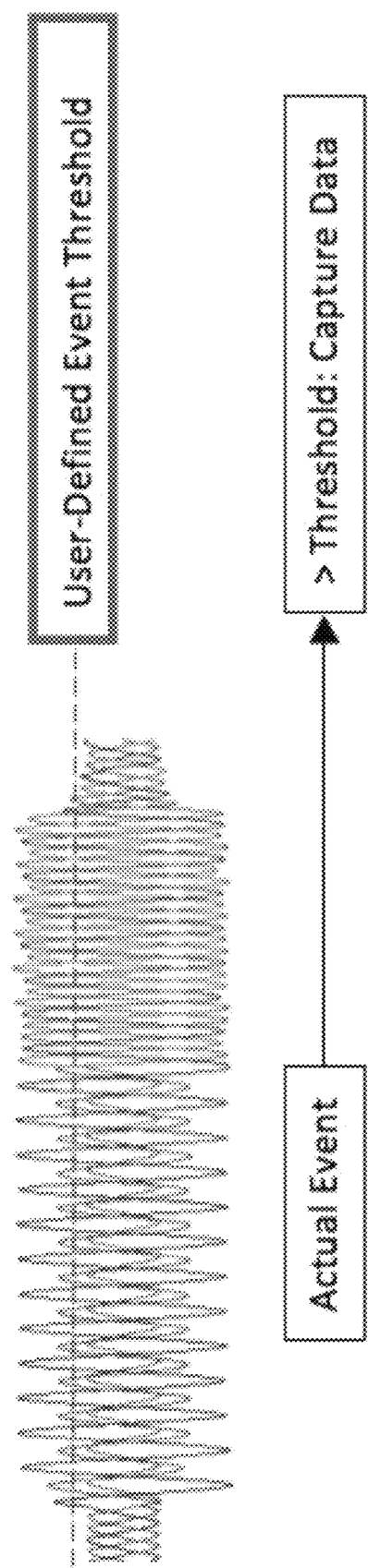
FIG. 5 illustrates exemplary online event and threshold data, according to one embodiment.

FIG. 5 illustrates exemplary online event and threshold data, according to one embodiment. The PMU data is typically collected from the system through hardware and stored in the hardware memory based on a user-defined event threshold. If the event threshold is not met then the event is not passed on to the generator dynamic model identification and tuning system and disregarded. If the event threshold is reached then a notification is sent to the user and the data is capture via the data acquisition network and sent to the generator dynamic model identification and tuning system.

Figure 6:
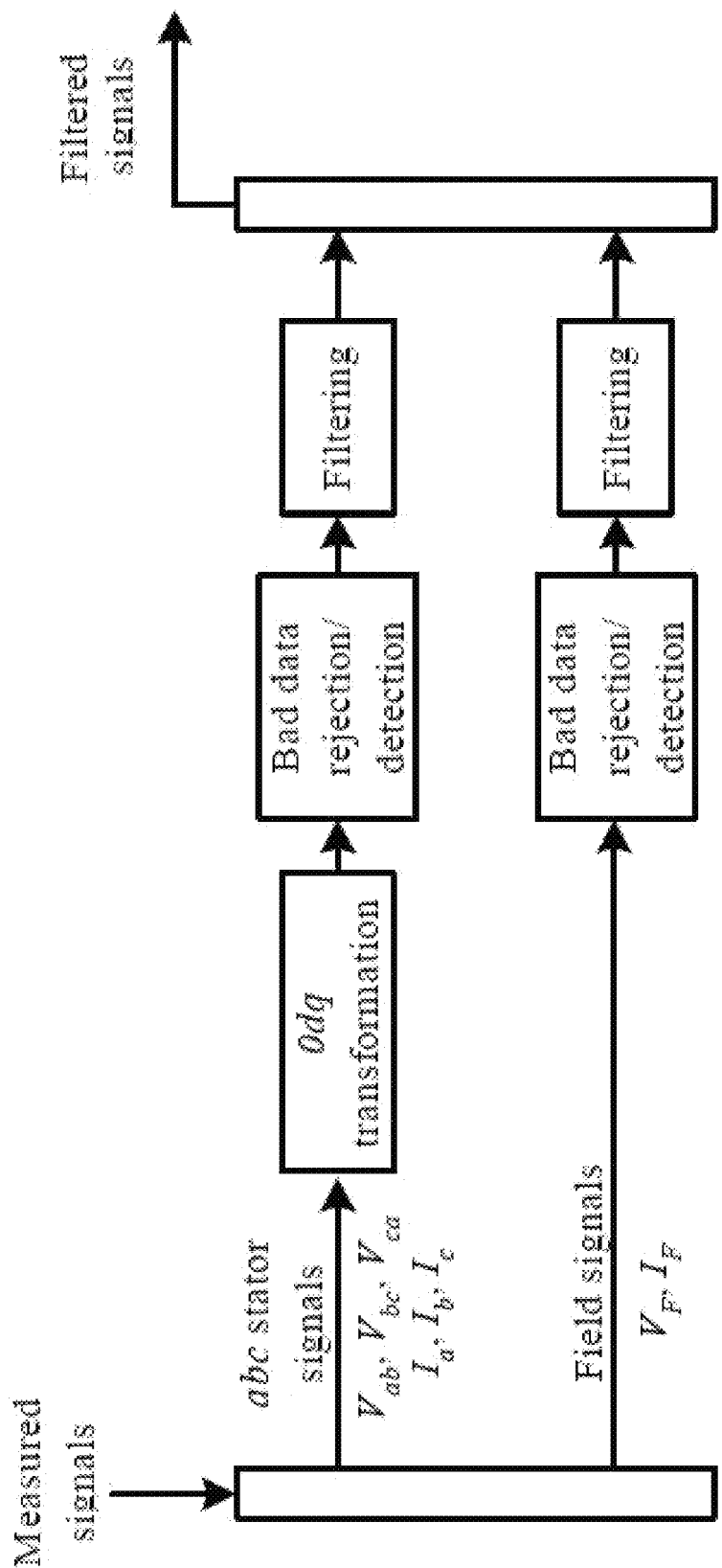
FIG. 6 illustrates an exemplary data acquisition, correction, and filtering flow for use with the present system, according to one embodiment.

FIG. 6 illustrates an exemplary data acquisition, correction, and filtering flow for use with the present system, according to one embodiment. Real data have errors resulting mainly from meter and communication errors, incomplete metering, or inaccuracy of metering equipment. Therefore, prior to any estimation it is necessary to perform bad data detection and rejection, and filtering of the noise.

After the transformation of the abc voltages and currents into 0dq signals through Park's transformation, a filter is applied to remove noise from the measurements. Such noise appears in the form of spikes, in the time domain plot of each signal. They are caused by metering errors and can be safely removed without risking inaccuracies in the identification and tuning process. If a noise in any one signal is detected, then the whole measurement at that time is removed from the data set. Multiple filters are to be utilized in order to also remove random background noise from the measurements through utilization of butterworth or adaptive noise filters.

FIG. 7 illustrates an exemplary generator configuration with an excitation system for use with the present system, according to one embodiment. The generator includes a synchronous machine 702, an excitation system 701, and a feedback control loop Output from the generator goes to a grid 703.

Excitation System 701 Model

Figure 8:
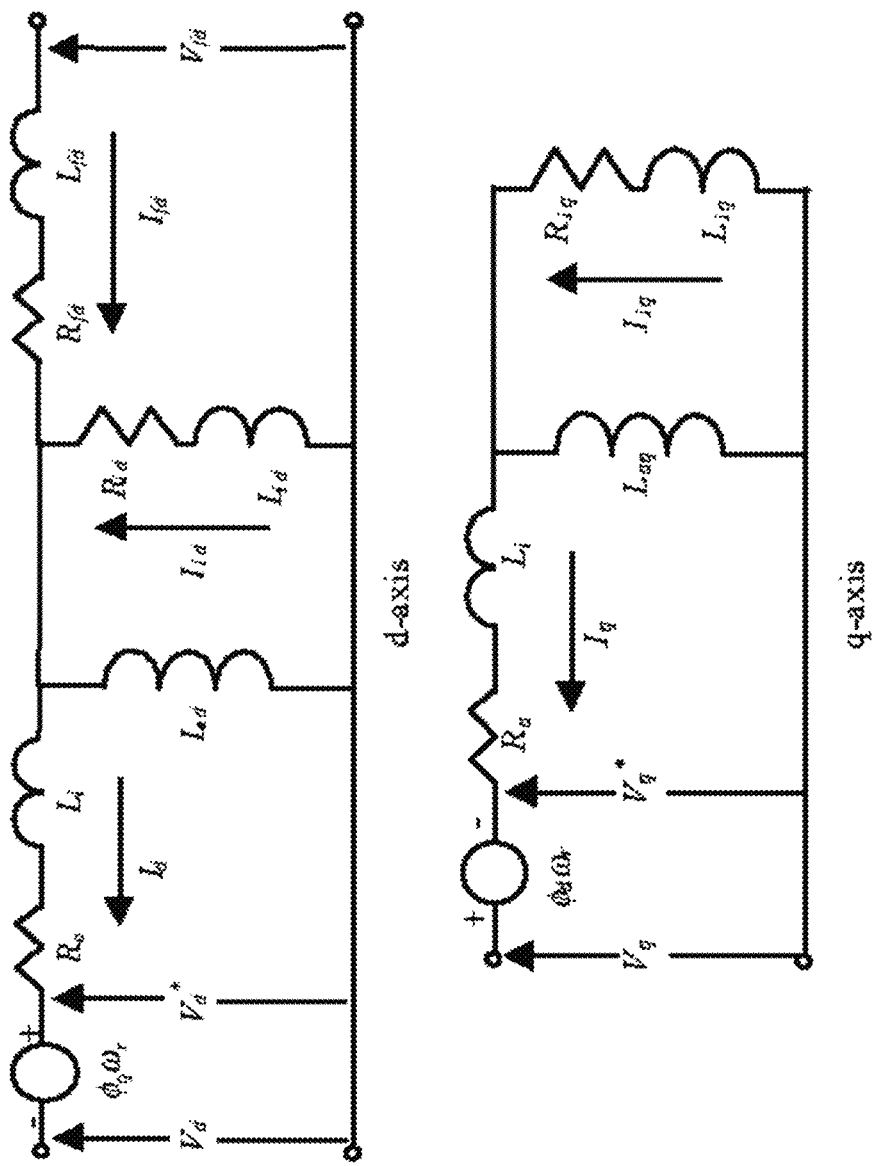
FIG. 8 illustrates an exemplary generator model for use with the present system, according to one embodiment.
Figure 9:
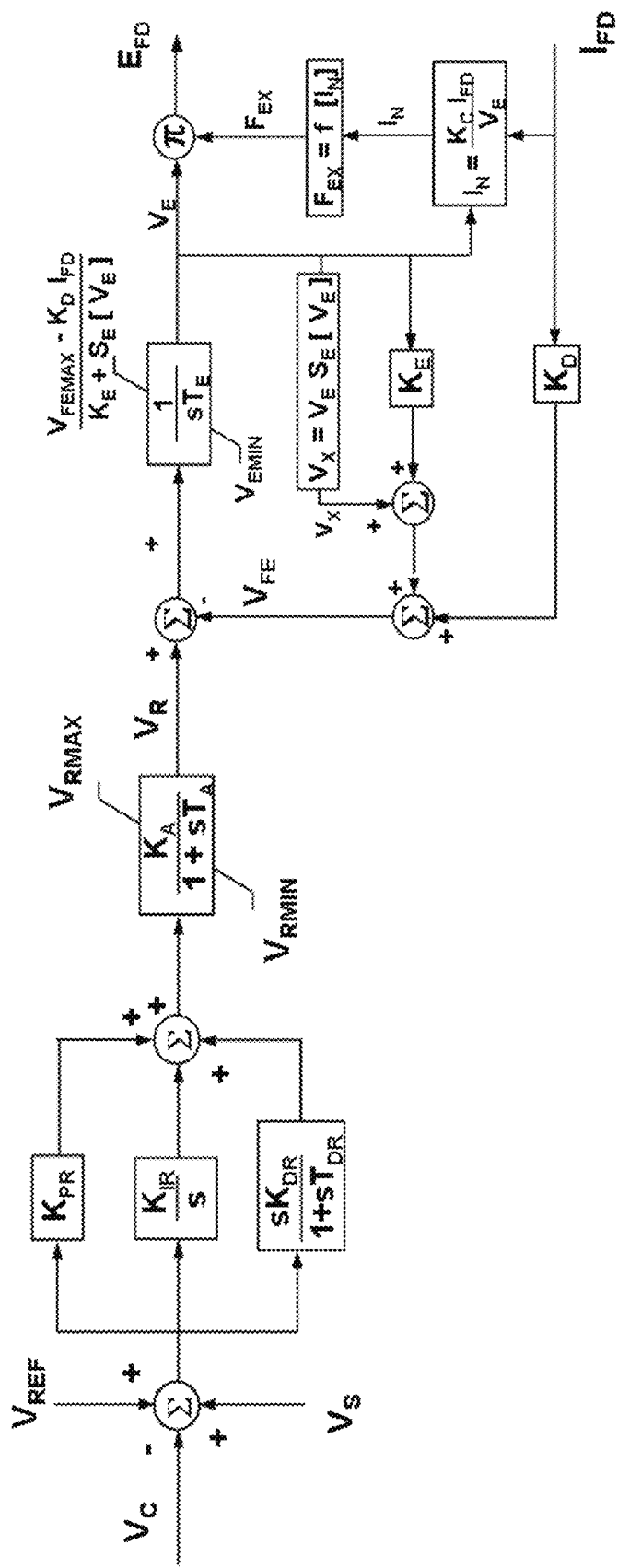
FIG. 9 illustrates an IEEE type AC8B excitation system model.

State space representation of the excitation system can be written as:

a. $\dot{x}_e(t) = A_e(\theta_e)x_e(t) + B_e(\theta_e)u_e(t)$ (6)

b. $y_e(t) = C_e x_e(t)$ (7)

where the variable sets are:

c. $x_e = [x_{e1} x_{e2} \ldots x_{en_e}]^T$—excitation system model state variables d. $y_e = [y_{e1} y_{e2} \ldots y_{em_e}]^T$—excitation system model output variables e. $\theta_e = [\theta_{e1} \theta_{e2} \ldots \theta_{ep_e}]^T$—excitation system model parameters f. $u_e = [u_{e1} u_{e2} \ldots u_{eq_e}]^T$—excitation system model inputs Synchronous Machine 702 Model State space representation of the synchronous machine can be written as:

g. $\dot{x}_g(t) = A_g(\theta_g)x_g(t) + B_g(\theta_g)u_g(t)$ (8)

h. $y_g(t) = C_g x_g(t)$ (9)

where the variable sets are:

i. $x_g = [x_{g1} x_{g2} \ldots x_{gn_g}]^T$—synchronous machine model state variables j. $y_g = [y_{g1} y_{g2} \ldots y_{gm_g}]^T$—synchronous machine model output variables k. $\theta_g = [\theta_{g1} \theta_{g2} \ldots \theta_{gp_g}]^T$—synchronous machine model parameters l. $u_g = [u_{g1} u_{g2} \ldots u_{gq_g}]^T$—synchronous machine model inputs Combined Model Combining equations (6) through (9), overall system model and state space representation become:

m. $\dot{x}(t) = A(\theta)x(t) + B(\theta)u(t)$ (10)

n. $y(t) = Cx(t)$ (11)

where the variable sets are:

o. $x = [x_1 x_2 \ldots x_n]^T$—generator and excitation system model state variables p. $y = [y_1 y_2 \ldots y_m]^T$—generator and excitation system model output q. $\theta = [\theta_1 \theta_2 \ldots \theta_p]^T$—generator and excitation system model parameters r. $u = [u_1 u_2 \ldots u_q]^T$—generator and excitation system model inputs And four coefficient matrices are:

s. $A(\theta) \in R^{n \times n}$—system matrix t. $B(\theta) \in R^{n \times q}$—input matrix u. $C \in R^{m \times n}$—output matrix Sample synchronous machine circuit models and excitation system transfer function models are illustrated in FIGS. 8 and 9. FIG. 8 illustrates an exemplary generator model for use with the present system, according to one embodiment. FIG. 9 illustrates an IEEE type AC8B excitation system model. Since the system is operating online, it can be assumed that number of measurement data points goes to infinity and the data is ergodic. Continuously applying the identification process will track model parameters to adapt system variations. A and B are the functions of generator and exciter parameter variable set θ. These functions are in general are non-linear to θ.

During the last two decades, subspace-based system identification (4SID) methods have attracted a great deal of interest in control community and been particularly developed, because they can identify system matrices of the state space model directly from the input and output data.

Equations (10) and (11) in discrete-time form can be written as:

a. $x(k+1) = A(\theta)x(k) + B(\theta)u(k)$ (12)

b. $y(k) = Cx(k)$ (13)

If needed, a modified state space model can be constructed from Equations (12) and (13):

c. $\tilde{x}(k+1) = T^{-1}A(\theta)T\tilde{x}(k) + T^{-1}B(\theta)u(k)$ (12)

d. $y(k) = CT\tilde{x}(k)$ (13)

by defining a linear transformation:

e. $\tilde{x}=T^{-1}x$ (14-1)

or f. $x=T\tilde{x}$ (14-2)

where T is in full rank.
Equations (12) and (13) can be re-written into:

g. $\tilde{x}(k+1)=\hat{A}(\theta)(k)+\hat{B}(\theta)u(k)$ (15)

h. $y(k)=\hat{C}\tilde{x}(k)$ (16)

Base conversion matrix T is chosen take the advantages of following facts, if applicable:

Make system matrix $\hat{A}(\theta)$ and input matrix $\hat{B}(\theta)$ simpler or more linear with respect to parameter set $\theta$.

Time constants represented by $\hat{A}(\theta)$ are larger than those by $A(\theta)$.

The objective is to identify system matrix $\hat{A}(\theta)$ and output matrix $\hat{B}(\theta)$ in Equation (10) and from which solve for model parameter $\theta$.

Subspace state space model identification (4SID) method allows to estimate model matrices $\hat{A}$, $\hat{B}$ and $\hat{C}$ from $N+\alpha-1$ points of data set of input and output measurements:

i. $Y_k=\{y(k)y(k+1) \ldots y(N+\alpha-1)\}$ (17-1)

j. $U_k=\{u(k)u(k+1) \ldots u(N+\alpha-1)\}$ (17-2)

Construct the following input-output equation derived in Equation (15):

k. $Y_\alpha = \Gamma_\alpha \tilde{X}_N + H_\alpha U_\alpha$ (18)

where l. $\tilde{X}_N = [\tilde{x}(1)\tilde{x}(k+2) \ldots \tilde{x}(k+N)]$ - state sequence matrix m. $Y_\alpha = \begin{bmatrix} y_1 & y_2 & \cdots & y_N \\ y_2 & y_3 & \cdots & y_{N+1} \\ \vdots & \vdots & \ddots & \vdots \\ y_\alpha & y_{\alpha+1} & \cdots & y_{N+\alpha-1} \end{bmatrix}$ - output block Hankel matrix n. $\Gamma_\alpha = \begin{bmatrix} \hat{C} \\ \hat{C}\hat{A} \\ \vdots \\ \hat{C}\hat{A}^{\alpha-1} \end{bmatrix}$ - extended observability matrix Equation (17) can solved by 4SID method and matrices $\hat{A}(\theta)$, $\hat{B}(\theta)$ and $\hat{C}$ are extracted from $\Gamma_\alpha$ and $\tilde{X}_N$. Model parameter $\theta$ can be finally evaluated.

Figure 10:
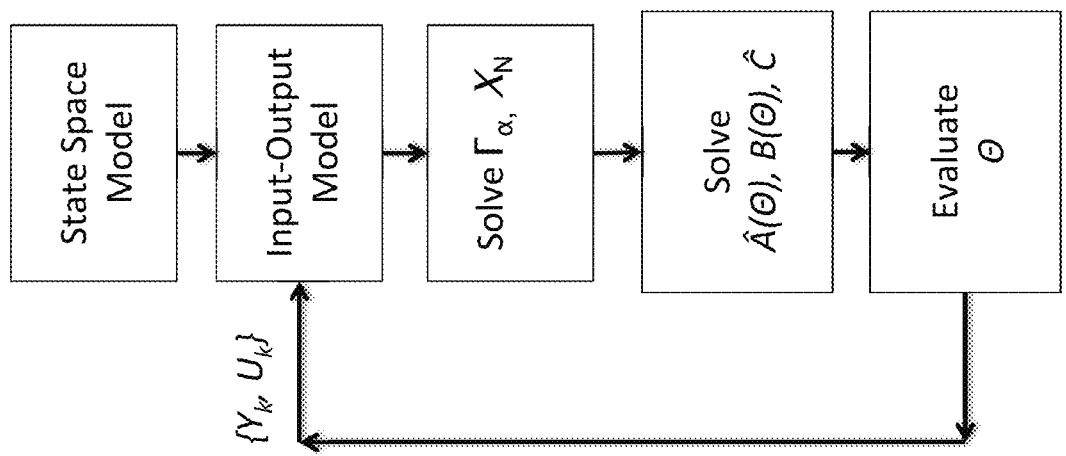
FIG. 10 illustrates an exemplary parameter tuning or estimation process for use with the present system, according to one embodiment.

FIG. 10 illustrates an exemplary parameter tuning or estimation process for use with the present system, according to one embodiment. In the process, online measurements $\{Y_k, U_k\}$ feed the calculation engine as if there is a rolling data window with a selected number of data points. At the end of each calculation cycle, model parameters $\theta$ are computed and updated.

Figure 11:
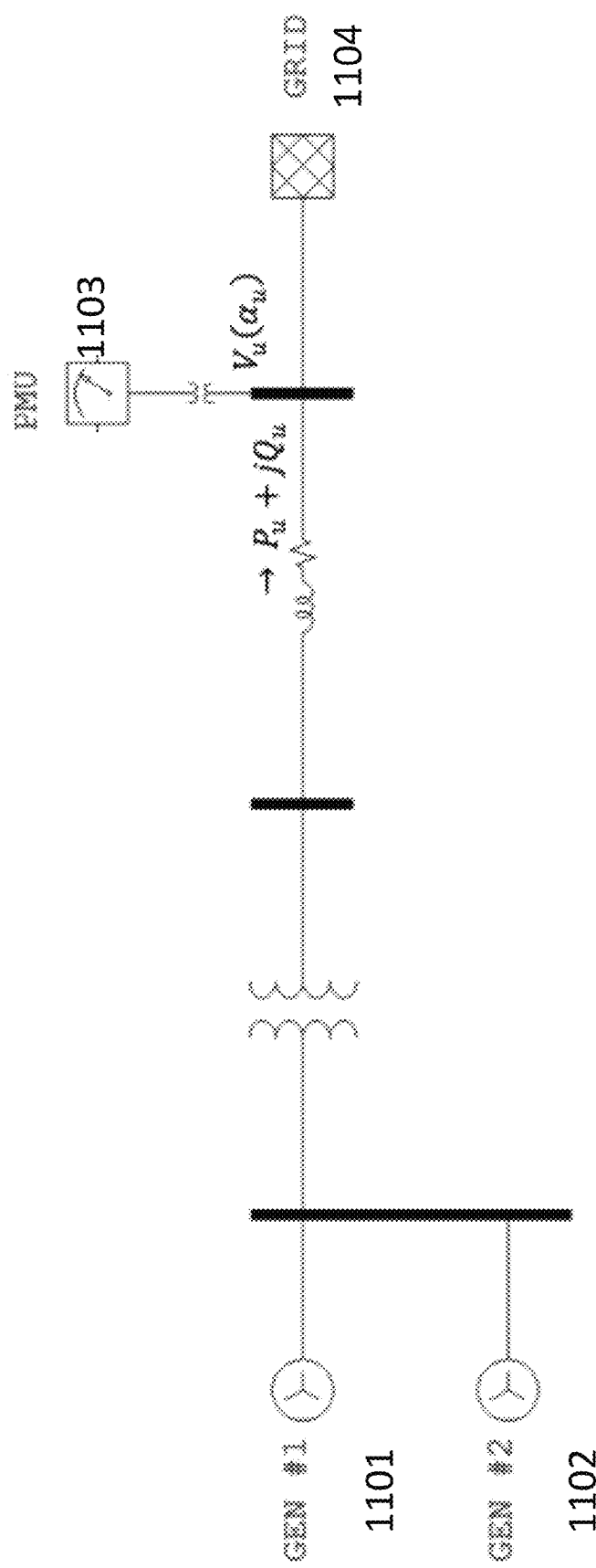
FIG. 11 illustrates an exemplary configuration with multiple generators for use with the present system, according to one embodiment.

FIG. 11 illustrates an exemplary configuration with multiple generators for use with the present system, according to one embodiment. The described algorithm can be extended to a more general system configuration with multiple generators 1101, 1102 in the system whose dynamic parameters are to be identified, a PMU 1103 located at a remote bus and a section of transmission system in between generators and the grid 1104. In this case, network state variables, i.e. bus voltage magnitudes and angles, are included in the overall equations.

Disclosures of the following references are considered relevant to the present disclosure, and are hereby incorporated by reference in their entirety.

L. Ljung, System Identification—Theory for the User, $2^{nd}$ ed. Englewood Cliffs, N.J.: Prentice-Hall, 1999.

V. I. Utkin, J. G. Gulner, and J. Shi, Sliding Mode Control in Electromechanical Systems. New York: Taylor & Francis, 1999.

Chin-Chu Tsai, Wei-Jen Lee, Eithar Nashawati, Chin-Chung Wu, Hong-Wei Lan, "PMU Based Generator Parameter Identification to Improve the System Planning and Operation", 2012 IEEE PES GM, San Diego, August 2012, paper No. GM0822.

E. P. T. Cari, L. F. C. Alberto, "Parameter Estimation of Synchronous Generators from Different Types of Disturbances", 2011 IEEE PES GM, July 2011, Detroit, Mich., paper No. 10.1109/PES.2011.6039592.

E. P. T. Cari, L. F. C. Alberto, N. G. Bretas, "A New Methodology for Parameter Estimation of Synchronous Generator from Disturbance Measurements", IEEE PES GM, Pittsburgh, Pa., July 2008, paper No. 10.1109/PES.2008.4596407.

H. Bora Karayaka, Ali Keyhani, Gerald Thomas Heydt, Baj L. Agrawal, "Synchronous Generator Model Identification and Parameter Estimation From Operating Data", IEEE Transactions on Energy Conversion, Vol., 18, No. 1, March 2003, pp. 121-126.

Jin-Cheng Wang, Hsiao-Dong Chiang, Chiang-Tsung Huang, Yuang-Tung Chen, Chung-Liang Chang, Chiung-Yi Huang, "Identification of Excitation System Models Based on On-line Digital Measurements, IEEE Transactions on Power Systems, Vol. 10, No. 3, August 1995, pp. 1286-1293.

H. Tsai, A. Keyhani, J. Demcko, R. G. Farmer, "On-Line Synchronous Machine Parameter Estimation from Small Disturbance Operating Data", IEEE Transactions on Energy Conversion, Vol. 10, No. 1, March 1995, pp. 25-36.

Adel A. Ghandakly, Jiang J. Dai, "An Adaptive Synchronous Generator Stabilizer Design by Generalized Multivariable Pole Shifting (GMPS) Technique", IEEE Transactions on Power Systems, Vol. 7, No. 3, August 1992, pp. 1239-1244.

The functions described may be implemented in hardware, software, firmware or any combination thereof. If implemented in software, the functions may be stored as one or more instructions on a computer-readable medium. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, include compact disc (CD), laser disc, optical disc, digital versatile disc (DVD), floppy disk, and Blu-ray® disc where disks usually reproduce data magnetically, while discs reproduce data optically with lasers.

Thus, certain aspects may comprise a computer program product for performing the operations presented herein. For example, such a computer program product may comprise a computer readable medium having instructions stored (and/ or encoded) thereon, the instructions being executable by one or more processors to perform the operations described herein. For certain aspects, the computer program product may include packaging material.

Software or instructions may also be transmitted over a transmission medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of transmission medium.

Further, it should be appreciated that modules and/or other appropriate means for performing the methods and techniques described herein can be downloaded and/or otherwise obtained by a user terminal and/or base station as applicable. For example, such a device can be coupled to a server to facilitate the transfer of means for performing the methods described herein. Alternatively, various methods described herein can be provided via storage means (e.g., RAM, ROM, a physical storage medium such as a compact disc (CD) or floppy disk, etc.), such that a user terminal and/or base station can obtain the various methods upon coupling or providing the storage means to the device. Moreover, any other suitable technique for providing the methods and techniques described herein to a device can be utilized.

Systems and methods for dynamic parameter estimation and tuning have been disclosed. It is understood that the embodiments described herein are for the purpose of elucidation and should not be considered limiting the subject matter of the disclosure. Various modifications, uses, substitutions, combinations, improvements, methods of productions without departing from the scope or spirit of the present invention would be evident to a person skilled in the art.

What is claimed is:

1. A system for optimizing generator parameters comprising:
   at least one generator;
   an online dynamic generator parameter estimation and tuning system, comprising:
      a server including an identification and tuning engine, wherein the server is in communication with;
      an online data acquisition network comprising one or more sensors;
      a user console; and
      a database comprising one or more generator models associated with one or more generators,
   wherein a processor of the identification and tuning engine selectively executes steps stored in non-transitory memory, such that the processor operably:
      receives monitoring data from the data acquisition network;
      determines whether a user-defined event has occurred;
      identifies current parameters associated with the user-defined event for inclusion in an execution of the one or more generator models, to create a current model;
      tunes the current parameters, after estimation, for the one or more generator models while the generator is online, based on a comparison of the current parameters and current model with a predefined deviation threshold;
      generate and send an output to the user console to validate and update one or more generator model based on the comparison of the current parameters and the current model with a predefined deviation; and
   wherein at least one generator's parameters are modified by analyzing them with the output generated by the online dynamic generator parameter estimation and tuning system and ensuring minimum deviation between the generator's parameters and the output.

2. The system of claim 1, wherein the processor of the identification and tuning engine further identifies and tunes the current parameters by:
   receiving at least one machine model including model controls;
   measuring online current event data using the one or more sensors;
   identifying if the current event data comprises bad data, and if so rejecting or filtering the bad data from good data;
   identifying and tuning model parameters based on the good data and the machine model;
   comparing the identified and tuned model parameters associated with the good data to the predefined deviation threshold; and
   based on the comparing, selecting one of:
      (a) the identified and tuned current parameters associated with the good data, or
      (b) identified and tuned parameters associated with a previous event.

3. The system of claim 1, wherein the one or more sensors is a PMU including real-time and synchronized devices.

4. The system of claim 1, wherein the one or more sensors comprises a plurality of sensors.

5. The system of claim 1, wherein the user console further comprises:
   a graphic user interface; and
   a processor operable to selectively execute instructions stored in non-transitory memory to generate one or more of a report, a log and an alert based on current parameters received from the server.

6. The system of claim 2, wherein the processor identifying bad data and if so rejecting or filtering the bad data from good data further comprises:
   receiving the monitoring data associated with the user-defined event including signals comprising:
      abc signals; and
      field signals;
   transforming the abc signals into 0dq signals by executing an algorithm using a transformation; and
   filtering the 0dq signals and the field signals to remove noise from the monitoring data associated with the user-defined event, wherein a measurement associated with signals having noise is removed from the monitoring data.

7. The system of claim 6, wherein the processor filtering the 0dq signals and the field signals to remove noise from the monitoring data is performed using one or more noise filters.

8. A computer implemented method of optimizing at least one generator's parameters, comprising:
   instructions, stored in non-transitory computer readable memory that, when executed by a processor, perform the steps of:
      upon receiving online monitoring data from at least one network connected sensor,
      identifying if the monitoring data indicates that a user-defined event has occurred, and if so, whether the monitoring data comprises bad data before rejecting or filtering the bad data from good data;

identifying and tuning current model parameters while online for a received machine model from a network connected database, including model controls, for inclusion of the good data in an execution of the machine model;

comparing the identified and tuned current model parameters associated with the good data to a predefined deviation threshold;

based on the comparing, selecting one option between:
  (a) the identified and tuned current parameters associated with the good data, or
  (b) the identified and tuned parameters associated with a previous event; and based on the selecting, modifying at least one generator's parameters to ensure minimum deviation between the selected option and the generator's parameters.

9. The method of claim 8, wherein the at least one network connected sensor is a PMU including real-time and synchronized devices.

10. The method of claim 8, wherein the current event data is measured using a plurality of sensors.

11. The method of claim 8, further comprising:
transmitting instructions to a network-connected user console that cause a processor of the user console to generate one or more of a report, a log and an alert based on received current parameters and viewable to a user on a graphical user interface of the user console.

12. The method of claim 8, wherein identifying if the current event data comprises bad data, and if so rejecting or filtering the bad data from the good data further comprises:
receiving current event data signals comprising:
  abc signals; and
  field signals;
transforming the abc signals into 0dq signals by executing an algorithm using a transformation; and
filtering the 0dq signals and the field signals to remove noise from the monitoring data associated with the user-defined event, wherein a measurement associated with signals having noise is removed from the current event data.

13. The system of claim 12, wherein the filtering the 0dq signals and the field signals to remove noise from the current event data is performed using one or more noise filters.

* * * * *